(12) United States Patent
Machida et al.

(10) Patent No.: US 6,601,314 B2
(45) Date of Patent: Aug. 5, 2003

(54) METHOD OF MANUFACTURING ALIGNMENT MARK

(75) Inventors: Satoshi Machida, Tokyo (JP); Akiyuki Minami, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 10/034,108

(22) Filed: Jan. 3, 2002

(65) Prior Publication Data
US 2002/0178600 A1 Dec. 5, 2002

(30) Foreign Application Priority Data
Jun. 1, 2001 (JP) ........................................ 2001-167240

(51) Int. Cl.⁷ .............................................. G01D 21/00
(52) U.S. Cl. ........................ 33/645; 438/975; 438/401; 257/797

(58) Field of Search .................. 33/645, 613; 414/935, 414/936; 257/797; 438/975, 401

(56) References Cited

U.S. PATENT DOCUMENTS

| | | | | |
|---|---|---|---|---|
| 6,157,087 A | * | 12/2000 | Zhao et al. | 257/797 |
| 6,232,200 B1 | * | 5/2001 | Chu | 438/401 |
| 6,391,745 B1 | * | 5/2002 | Kwon | 257/797 |
| 6,395,617 B2 | * | 5/2002 | Ando | 438/401 |
| 6,440,816 B1 | * | 8/2002 | Farrow et al. | 438/401 |

* cited by examiner

*Primary Examiner*—Christopher W. Fulton
(74) *Attorney, Agent, or Firm*—Rabin & Berdo, P.C.

(57) ABSTRACT

A method for manufacturing a highly reliable alignment mark in which by-products do not form at an aligning mark position during patterning. In this method, an intermediate layer is disposed on an upper layer of a first wiring to protect the first wiring. Then, a filling material is coated thereon to fill in a through hole. Thereafter, a plug is formed by etch-backing, and a second wiring is formed.

13 Claims, 8 Drawing Sheets

METHOD OF MANUFACTURING ALIGNMENT MARK

BACKGROUND OF THE INVENTION

1. Field of the Invention

The present invention relates to a method of manufacturing an alignment mark, and, in particular, to a method of manufacturing an alignment mark for aligning an upper layer pattern and a lower layer pattern with each other during the manufacture of an integrated circuit pattern.

2. Description of the Related Art

A semiconductor integrated circuit device (which is referred to as an "LSI" hereinafter) is manufactured by a method comprising: a coating (film-forming) step, in which a material film made of a desired material is formed on an LSI substrate (which is referred to as a "wafer" hereinafter) to form an LSI element; a photolithographic step, in which a resist pattern is formed by transferring an integrated circuit pattern (which is referred to as a "circuit pattern" hereinafter) onto a photosensitive high polymer film (which is referred to as a "resist film" hereinafter); and an etching step, in which the material film disposed beneath a resist film is etched by using the resist pattern as a blocking layer.

An LSI is manufactured stereoscopically by repeating the coating step, the photolithographic step, and the etching step in combination with one another a necessary number of times to thereby form stacked pattern forming layers.

Generally, an original plate (which is referred to as a "mask" hereinafter) is used in the photolithographic step. The original plate comprises a circuit pattern film, made of a material such as chromium that shields light to which the materials exposed, disposed on a material such as a glass substrate through which exposure light is transmitted. The pattern of the circuit pattern film formed on the mask (which is referred to as a "mask pattern" hereinafter) is imaged on the resist film by magnifying or reducing the pattern using a reflection or projection optical system, whereby the resist is exposed, the resist film is sensitized in a mask pattern, and a resist pattern is formed. Then, on the basis of the resist pattern, the layer formed beneath the resist film is patterned.

When an LSI is manufactured, a stereoscopical LSI element is formed by stacking circuit patterns. LSI performance is influenced to a great extent by the relative accuracy to which the circuit pattern on the wafer that has already been processed and formed, and the circuit pattern that is to be formed by exposure are aligned in the photolithographic step. Therefore, it is essential to align the two circuit patterns so that their positions match with high precision.

In the photolithographic step, the mask and the wafer are aligned relative to each other in order to relatively align with high precision the circuit pattern that has already been processed and formed on the wafer and the circuit pattern that is to be formed by exposure and development.

This alignment is carried out by using marks for detecting an alignment position (alignment marks) formed at the mask and the wafer. The alignment mark at the mask is formed as a portion of the mask pattern. Generally, an exposure device comprises: position measurement means for detecting these two alignment marks and measuring relative alignment thereof; and moving means for moving each of the mask and the wafer to a desired position. Prior to exposure, on the basis of the results obtained from the position measurement means that has detected the two alignment marks and measured relative alignment thereof, the moving means moves at least one of the mask and the wafer, whereby, the alignment mark formed on the wafer and the alignment mark formed on the mask are precisely aligned.

In this case, relative misalignment between the pattern formed during the previous photolithographic step and the pattern underlying this pattern is fed back as alignment correction information during exposure. Accordingly, it becomes possible to align the mask and the wafer with greater precision.

This alignment correction information is obtained by measuring two types of marks: a resist mark formed as a portion of the resist pattern; and a reference mark formed as a portion of a pattern that has been formed beneath the resist pattern.

As an example, description will be given of an alignment mark that is utilized in the photolithographic step in a method of manufacturing a wiring layer. The wiring layer is a main constituent element of the LSI. This method comprises a series of steps in which an interlayer insulating layer is formed on a first wiring layer, a connection hole (which is referred to as a "via hole" hereinafter) for electrically connecting the first wiring layer and a second wiring layer that is disposed on the interlayer insulating layer is formed in the interlayer insulating layer, and then, the second wiring layer is formed on the interlayer insulating layer.

In particular, since it is necessary in this method to align with high precision the second wiring layer with the via hole formed in the interlayer insulating layer, it is preferable to form an alignment mark on the interlayer insulating layer when the interlayer insulating layer is formed beneath the second wiring layer.

Figure 8:
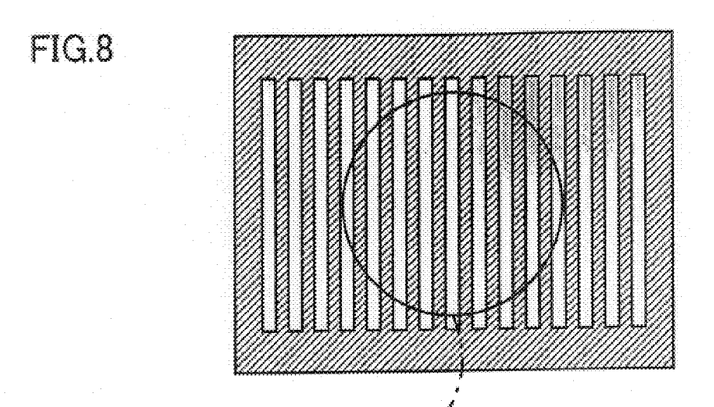
FIG. 8 is a top view of an alignment mark pattern that is formed by a conventional process.

Various shapes can be used for the alignment mark. Description of a case in which an alignment mark of a pattern (shape) shown in FIG. 8 is used will be given as an example. The alignment mark shown in FIG. 8 is configured such that grooves are disposed, with portions of an upper surface of a wiring pattern disposed beneath the alignment mark being visible in the grooves.

First, when the via hole is formed in the interlayer insulating layer that has been formed uniformly on the first wiring layer, an alignment mark is formed at the same time that the via hole is formed. The alignment mark is formed in a region other than a device region in which a pattern for structuring an LSI, such as a via hole, wiring or circuitry is formed.

Next, a film comprising a conductive material and forming an overlying wiring pattern, and a resist film that has, for example, a thickness of about 300 nm to about 2000 nm are formed uniformly over the entire interlayer insulating layer having the alignment mark formed thereon.

Then, the alignment mark formed on the mask and the alignment mark formed on the interlayer insulating layer are detected by using the mask having the wiring pattern formed thereon. Misalignment between the mask and the wafer is measured, and the result of the measurement is outputted to the moving means. The mask and the wafer are moved relative to each other by the moving means to eliminate any misalignment between the mask and the wafer, whereby the two alignment marks are aligned with high precision. It should be noted that the alignment mark formed on the interlayer insulating layer is detected by detecting a gap between the top surface of the interlayer insulating layer and the bottom of the grooves forming the alignment mark.

However, because the alignment mark is formed on the same layer on which the device pattern, such as a via hole, wiring or circuitry, for forming the LSI is formed, a problem arises in that by-products may be formed on the alignment during device patterning (FIG. 9), whereby the shape of the alignment mark is changed and reliability of the alignment mark is lowered.

Figure 10A:
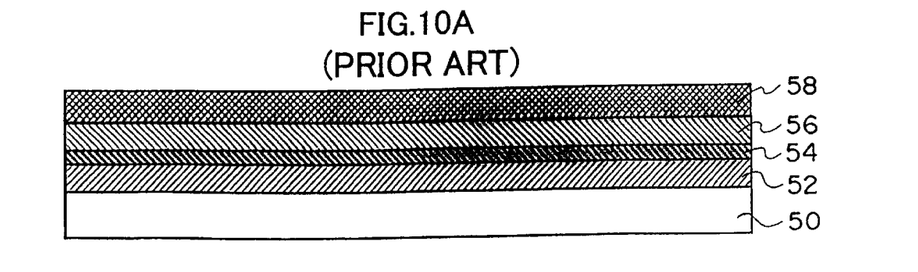
FIGS. 10A through 10D are process drawings illustrating a conventional art.

Description will be given of an example in which a conductive material is filled in the via hole through which the upper wiring pattern and the lower wiring pattern are electrically connected to each other. First, as shown in FIG. 10A, a first wiring 54 and a second interlayer insulating layer 56 are sequentially formed on a first interlayer insulating layer 52, comprising $SiO_2$ or the like, and a wafer 50. Then, resist is coated on the surface to thereby form a resist film 58.

Figure 10B:
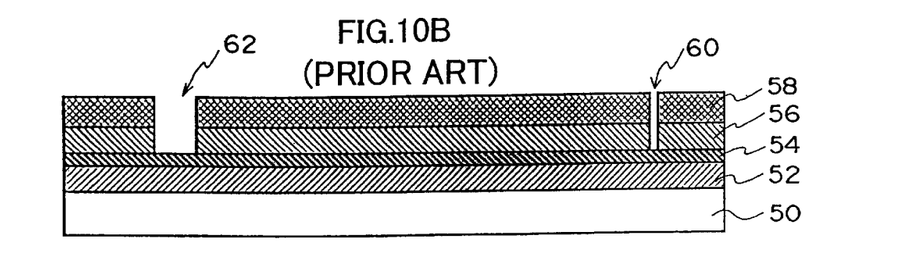

Next, as shown in FIG. 10B, a via hole 60 is formed in an LSI element forming region of the second interlayer insulating layer 56 by photolithography and etching, and a groove-shaped alignment mark 62 is formed in an alignment mark forming region of the second interlayer insulating layer 56. The alignment mark forming region is a predetermined region outside of the device pattern forming region.

Figure 10C:
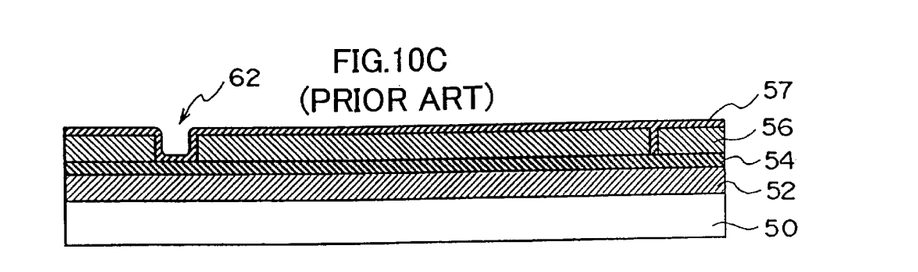

After removing the resist film 58, as shown in FIG. 10C, an electrically conductive film 57 comprising an electrically conductive filling material (e.g., comprising either tungsten or polysilicon or comprising a metal disposed on tungsten, a metal disposed on polysilicon, or a metal disposed on tungsten and polysilicon) is coated uniformly on the entire surface, whereby the entire via hole 60 is filled in with the material. Typically, the via hole 60 is about 0.5 $\mu$m or less, and the width W of the alignment mark 62 is about 1 $\mu$m to about several $\mu$m. Since the alignment mark 62 is larger than the via hole 60, the alignment mark 62 region is not entirely filled in with the filling material.

Figure 10D:
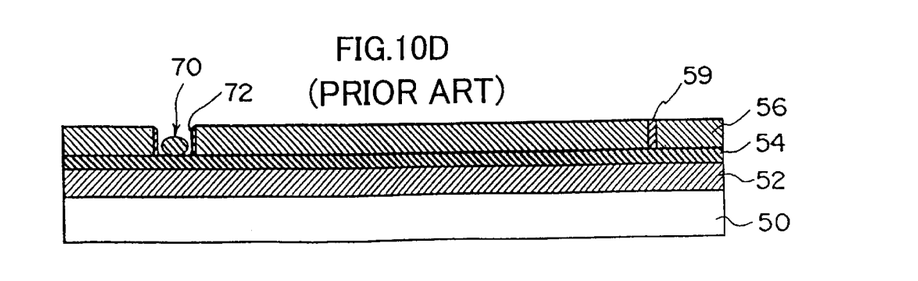

After the filling material has been coated, it is removed by etch-backing so that only the filling material inside the via hole 60 remains, whereby a plug 59 is formed. Depending on the combination of wiring material and etching gas, when aluminum is contained in the wiring material and chloride is contained in the etching gas, a by-product 70 may be produced at the bottom of the alignment mark 62 due to reaction between a component contained in the exposed wiring material at the bottom of the alignment mark 62 and a component contained in the etching gas, or due to reaction between a component contained in the wiring material, a component contained in the etching gas, and a component in the environmental atmosphere in which a wafer is placed. Because the by-product 70 comprises gel whose volume has expanded, the shape, size, and distribution density of the by-product 70 are non-uniform, it is difficult to remove the by-product 70 by uniform treatment.

Figure 9:
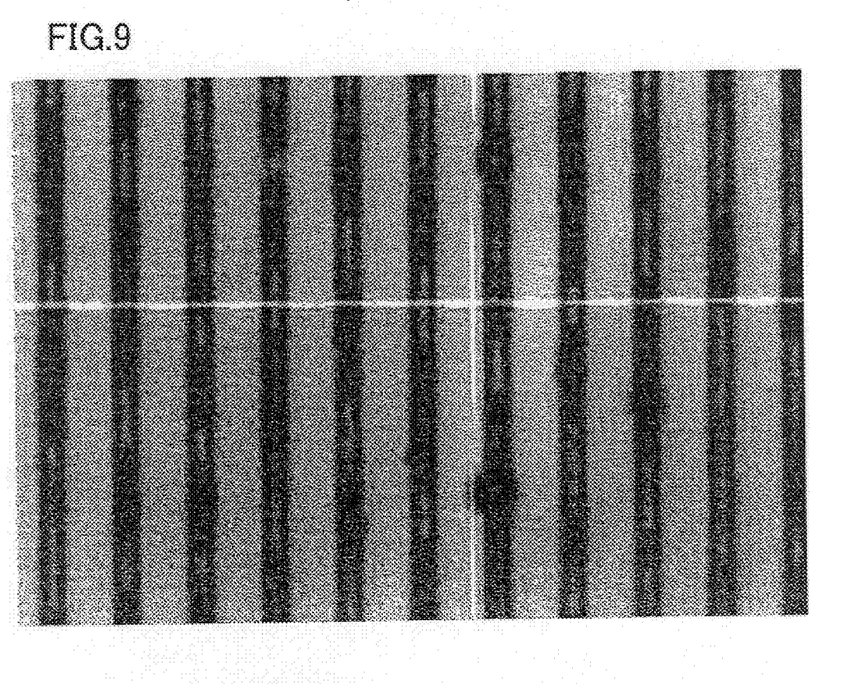
FIG. 9 is an enlarged view of a pattern portion of the alignment mark that is shown in FIG. 8.

Since the by-product 70 is actualized as foreign matter and changes the shape of the alignment mark, as shown in FIG. 9, there is a drawback in that reliability of the alignment mark as a mark for detecting an alignment position is compromised.

SUMMARY OF THE INVENTION

An object of the present invention is to provide a method of manufacturing a highly reliable alignment mark, in which by-products are prevented from being formed at an alignment mark position during patterning.

A first aspect of the present invention is a method of manufacturing an alignment mark for aligning a pattern of a first pattern layer and a pattern of a second pattern layer in a predetermined layout when the first pattern layer and the second pattern layer are layered together on a wafer, comprising: forming a first alignment mark in a predetermined region of the first pattern layer during the formation of the first pattern layer, forming a second alignment mark by cutting the second pattern layer at a predetermined position thereof on the basis of the first alignment mark, providing a protective layer for protecting the second alignment mark, and forming a predetermined pattern in a pattern forming region of the second pattern layer by using the first alignment mark.

In the method of manufacturing the alignment mark according to the first aspect of the present invention, since a layer for protecting the second alignment mark is provided, even if the first pattern layer is exposed at the bottom of the second alignment mark, the second alignment mark is covered with the protective layer when a pattern is formed on the second pattern layer. Accordingly, drawbacks due to the first pattern layer being exposed and by-products being formed can be eliminated.

For example, if the first pattern layer is a wiring layer comprising an electrically conductive material, and the second pattern layer is an insulating layer serving as an interlayer insulating layer and comprising an insulating material, after a portion of the second pattern layer is cut by etching and the surface of the first pattern layer is exposed to form the alignment mark, a layer protecting at least the alignment mark is provided, and the circuit forming region of the second pattern layer is then patterned. Therefore, drawbacks resulting from the first pattern layer being exposed, such as the residual etching gas and the first pattern layer reacting with each other after etch-backing when a circuit is formed on the second pattern layer thereby producing a by-product, can be avoided.

The protective layer can be formed, for example, by coating the entire surface with the insulating material, to a thickness at which the second alignment mark is not entirely filled in. Alternatively, resist can be used as a temporary protective layer when a predetermined pattern is formed in the pattern forming region of the second pattern layer by forming resist to a thickness at which the second alignment mark is filled in; forming the predetermined pattern at the pattern forming region of the second pattern layer; and removing the resist to expose the second alignment mark.

When the second alignment mark is formed by cutting the second pattern layer, the second pattern layer can be left and used as a protective layer. Therefore, it becomes unnecessary to use another material to form the protective layer. In this case, the protective layer can be formed merely by changing a way in which the second pattern layer is cut, which is preferable because costs can be reduced and there is no need for additional manufacturing steps.

A second aspect of the present invention is a method of manufacturing an alignment mark for aligning a pattern of a first pattern layer and a pattern of a second pattern layer in a predetermined layout when the first pattern layer and the second pattern layer are layered together, comprising: forming a first alignment mark in a predetermined region of the first pattern layer during the formation of the first pattern layer, and by using the first alignment mark, forming a second alignment mark at a predetermined position of the second pattern layer and forming a predetermined pattern in a pattern forming region of the second pattern layer, wherein a feature size Wm of the second alignment mark and a feature size Wv of a predetermined pattern which is formed on the second pattern layer are determined to satisfy Wv<Wm<2×Wv.

The diameter Wm of the alignment mark is larger than the diameter Wv of the predetermined pattern formed on the circuit forming region and smaller than twice the diameter Wv of the predetermined pattern formed on the circuit forming region. Therefore, the filling material is filled in the predetermined pattern having the diameter of Wv. At least a thickness Wv of the filling material remains within the alignment mark after the filling material has been coated on the entire surface of a wafer and then removed from the top surface by etch-backing. The remaining filling material acts as the protective layer for the alignment mark.

As a result, drawbacks resulting from the first pattern layer being exposed, such as the residual etching gas and the first pattern layer reacting with each other after etch-backing when the circuit is formed on the second pattern layer, thereby producing a by-product, can be avoided.

DETAILED DESCRIPTION OF THE EMBODIMENT

Four embodiments of the present invention will be described hereinafter with reference to drawings.

First Embodiment

Figure 4A:
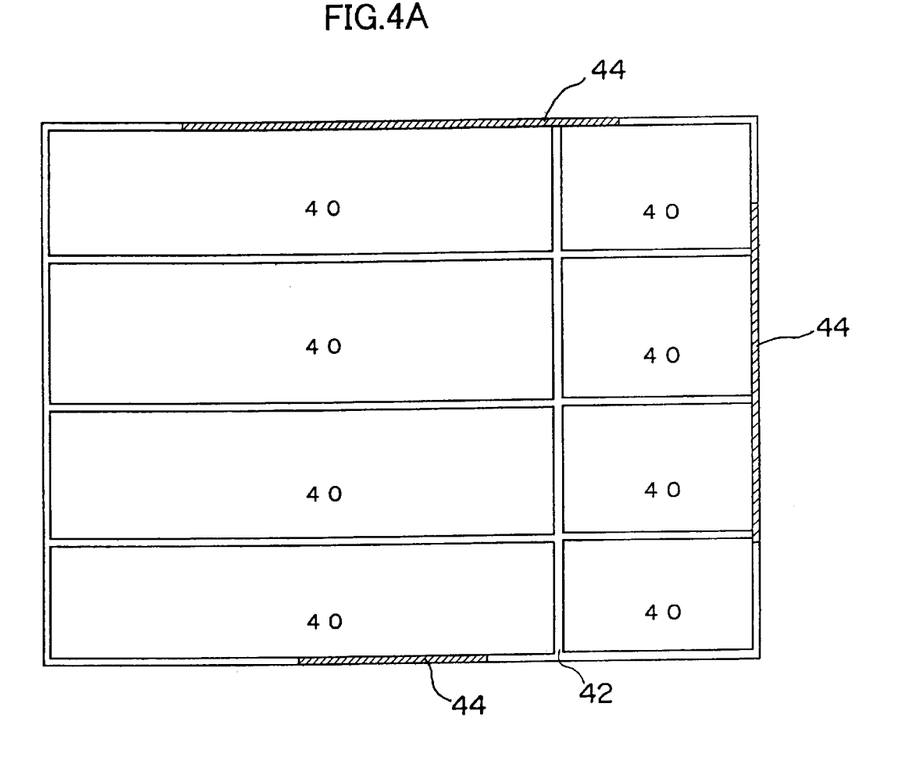
FIG. 4A is a schematic top view illustrating a partial region of a wafer.

In FIG. 4A, a partial region of a wafer 10 is shown. Scribe lines 42, which are regions that are cut when the wafer 10 is divided into individual devices, are formed around device forming regions 40. An alignment mark forming region 44, at which an alignment mark is formed to align an upper layer and a lower layer during the manufacture of the devices, is disposed at portions of the scribe lines 42.

Figure 4B:
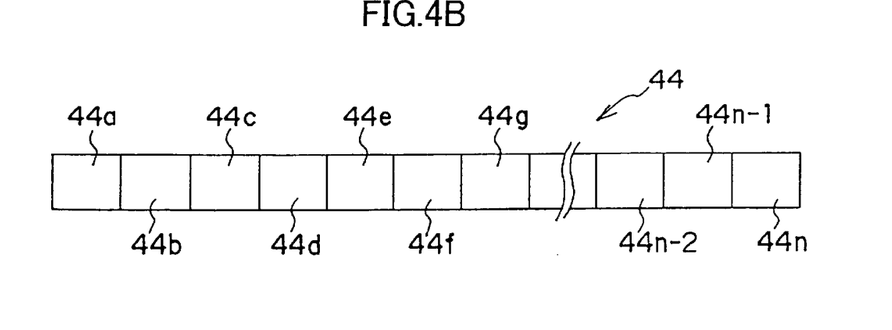
FIG. 4B is an enlarged explanatory view of a region in which an alignment mark shown in FIG. 4A is formed.

As shown in FIG. 4B, each alignment mark forming region 44 is divided into a plurality. Each divided region is used to align layers that comprise the devices.

Figure 1A:
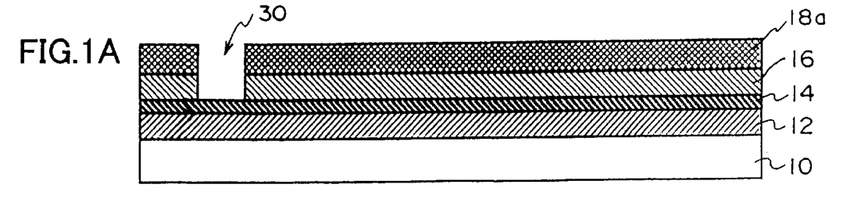
FIGS. 1A through 1F are process drawings illustrating a first embodiment of the present invention.
Figure 1B:
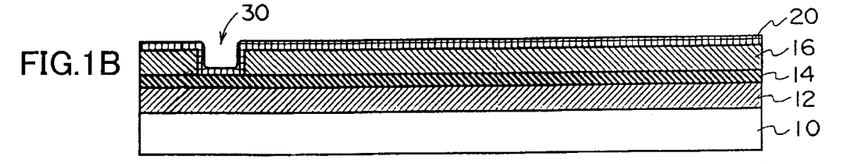
Figure 1C:
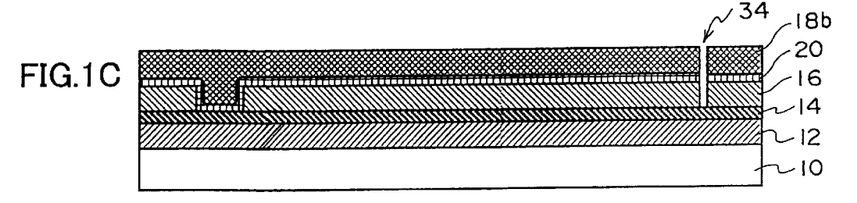
Figure 1D:
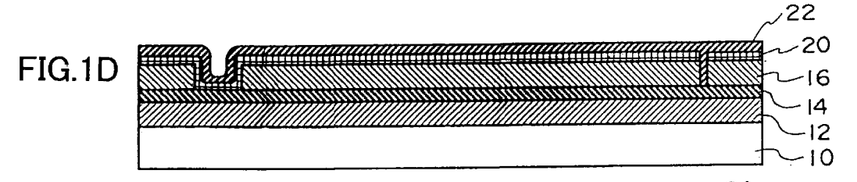
Figure 1E:
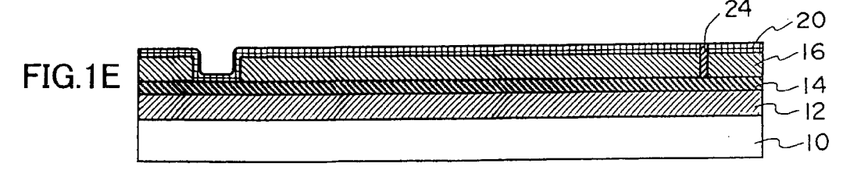
Figure 1F:
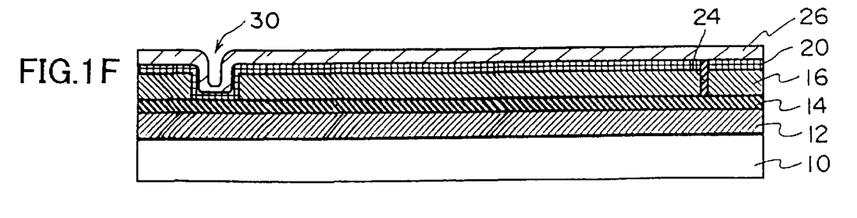

In a first embodiment of the present invention, as shown in FIG. 1F, a second wiring 26 is provided above a second interlayer insulating layer 16 and a first wiring 14 is provided below the second interlayer insulating layer 16. The second wiring 26 and the first wiring 14 are electrically connected to each other via a plug 24 that is formed by filling a metal in a via hole 34 in the second interlayer insulating layer 16.

After a first interlayer insulating layer 12 comprising $SiO_2$ or the like, the first wiring 14, and the second interlayer insulating layer 16 have been sequentially disposed on the wafer 10, photoresist (which is referred to as "resist" hereinafter) is coated on the entire surface of the wafer, to a thickness of about 300 nm to about 2000 nm, to form a resist film 18a.

Figure 2A:
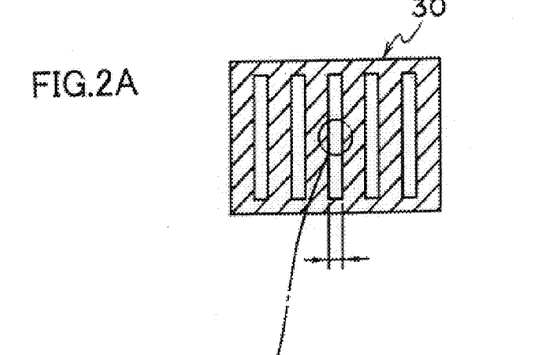
FIGS. 2A and 2B are top views illustrating an example of an alignment mark pattern.
Figure 2B:
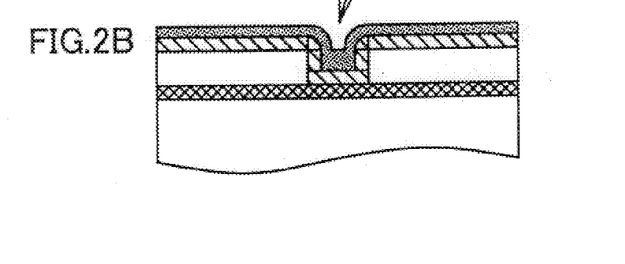

Next, by using photolithography, a pattern of an alignment mark 30 is exposed onto an alignment mark forming region 44b of the resist film 18a. Alignment of the exposure position is carried out by using the alignment mark 30 which has been formed in an alignment mark forming region 44a on the same layer as the lower layer having a pattern which has been formed during the previous step. In the first embodiment of the present invention, the alignment mark 30 having a grating pattern as shown in FIG. 2 is formed.

Thereafter, in accordance with the type of resist (negative or positive), the non-exposed region (or the exposed region) of the resist film 18a is removed by development to expose the surface of the second interlayer insulating layer 16 in conformity with the pattern of the alignment mark 30. Further, the exposed portion of the second interlayer insulating layer 16 is removed by etching, and as shown in FIG. 1A, the alignment mark 30 is formed.

Next, the resist film 18a is removed by etching, and as shown in FIG. 1B, an intermediate layer 20 comprising an insulating material such as silicon nitride or silicon dioxide is coated on the entire surface, to a thickness of about 200 nm.

Thereafter, resist is coated on the entire surface of the intermediate layer 20 to thereby form a resist film 18b. At this time, the alignment mark 30 is filled in with the resist.

Using the alignment mark 30 formed in the alignment mark forming region 44a, a via hole pattern is formed at a predetermined position of an LSI element forming region of the resist film 18b by photolithography and etching. Thereafter, in accordance with the type of resist, the non-exposed region (or the exposed region) of the resist film 18a is removed by development to expose the surface of the intermediate layer 20 in conformity with the pattern. The exposed portion of the intermediate layer 20 is also removed by etching to expose the surface of the second interlayer insulating layer 16 in conformity with the pattern. Furthermore, the exposed portion of the second interlayer insulating layer 16 is removed by etching to form the via hole 34, as shown in FIG. 1C.

Then, the resist film 18b is removed by etching. As shown in FIG. 1D, an electrically conductive filling material 22 (e.g., comprising either tungsten or polysilicon or comprising a metal disposed on tungsten, a metal disposed on polysilicon, or a metal disposed on tungsten and polysilicon) is coated on the entire surface, to a thickness at which the entire via hole 34 is filled in with the material 22. The width of the alignment mark 30 is from 1 $\mu$m to several $\mu$m, and the diameter of the via hole 34 of a highly integrated LSI having fine patterns is generally no more than about 0.5 $\mu$m. Therefore, even if the filling material 22 is coated to a thickness at which the entire via hole 34 is filled in with the material 22, the entire alignment mark 30 is not filled in by the same.

After the filling material 22 has been removed by etch-backing treatment, as shown in FIG. 1E, the only filling material 22 to remain is that inside the via hole 34, whereby the plug 24 is formed. After the plug 24 has been formed, the second wiring 26 is formed as shown in FIG. 1F, and a multilayer wiring structure is completed by electrically connecting the first wiring 14 and the second wiring 26 to each other via the plug 24.

Figure 3:
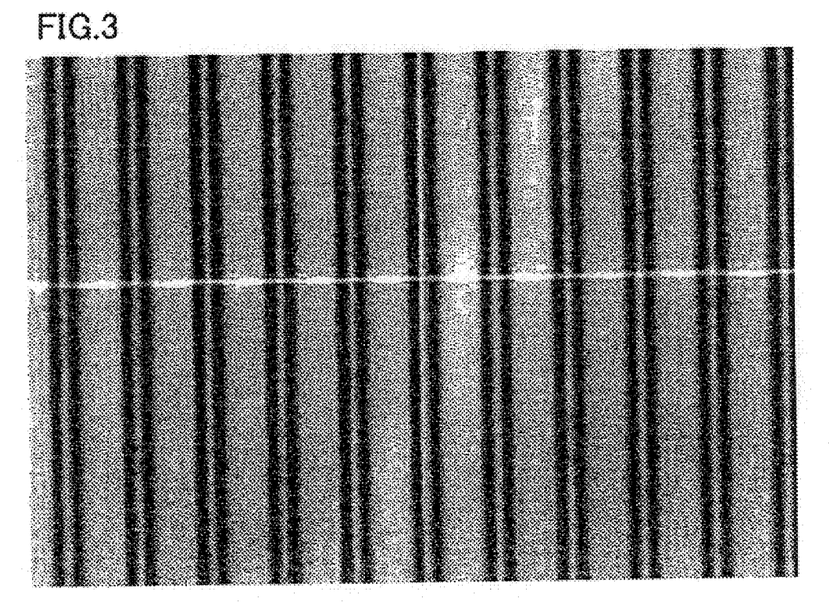
FIG. 3 is a top view of an alignment mark pattern that is formed by the process of FIGS. 1A through 1F.

When etch-backing is carried out, the filling material 22 at the bottom of the alignment mark 30 is completely removed. However, because the intermediate layer 20 is disposed beneath the filling material 22, the intermediate layer 20 protects the first wiring 14 by preventing the first wiring 14 from being exposed. Since etching gas does not react with the first wiring 14, by-products are not produced at the bottom of the alignment mark 30, and as shown in FIG. 3, the high quality alignment mark 30 having clear grating is formed. Therefore, when an upper layer is formed thereafter, it is possible to align the layer with high precision using the alignment mark 30.

Second Embodiment

Figure 5A:
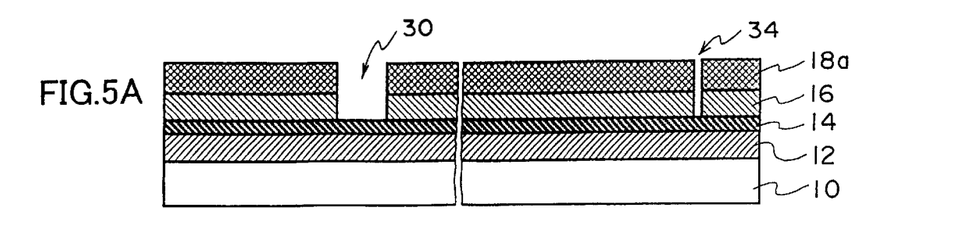
FIGS. 5A through 5E are process drawings illustrating an example of a second embodiment of the present invention.
Figure 5B:
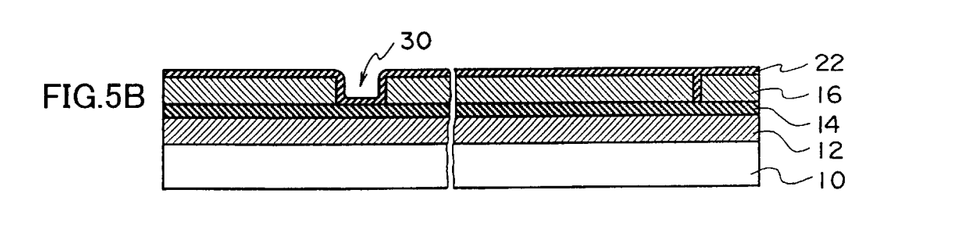
Figure 5C:
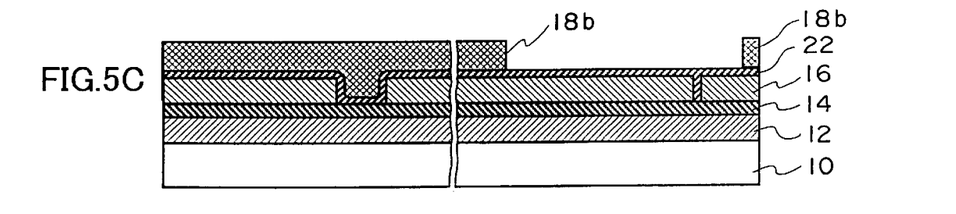

A second embodiment of the present invention will be described next. Portions identical to those of the first embodiment will be denoted by the same reference numerals and description thereof will be omitted. The first wiring 14 is disposed below the second interlayer insulating layer 16 and the second wiring 26 is disposed above the second interlayer insulating layer as shown in FIG. 5E. The first wiring 14 and the second wiring 26 are electrically connected to each other via the plug 24. The plug 24 is formed by filling a metal in the via hole 34. The via hole 34 is formed in the second interlayer insulating layer 16.

The first interlayer insulating layer 12 comprising $SiO_2$ or the like, the first wiring 14, and the second interlayer insulating layer 16 are sequentially disposed on the surface of the wafer 10. Then, resist is coated on the entire surface of the second interlayer insulating layer 16, to a thickness of about 300 nm to about 2000 nm, to form the resist film 18a.

Next, the pattern of the alignment mark 30 is formed by photolithography in the alignment mark forming region of the resist film 18a. A via hole pattern is formed at a predetermined position of an LSI element forming region. The pattern of the alignment mark 30 is exposed to light at the alignment mark forming region 44b. Alignment of the exposure position is carried out by using the alignment mark 30 formed in the alignment mark forming region 44a on the same layer as the lower layer having the pattern formed during the previous step.

Thereafter, in accordance with the type of resist, the non-exposed region (or the exposed region) of the resist film 18a is removed by development to expose the surface of the second interlayer insulating layer 16 in conformity with the pattern. Further, the exposed portion of the second interlayer insulating layer 16 is removed by etching. Therefore, as shown in FIG. 5A, the groove-shaped alignment mark 30 is formed in the alignment mark forming region. The via hole 34 is formed at a predetermined position of the LSI element forming region. Moreover, the layout of the alignment mark 30 and the via hole 34 is predetermined. Depending on the design of the LSI, this layout can be changed.

Next, the resist film 18a is removed by etching. As shown in FIG. 5B, the electrically conductive filling material 22 is coated on the entire surface, to a thickness at which the entire via hole 34 is filled in with the material 22.

Resist is then coated on the entire surface to form the resist film 18b, and only the LSI element forming region (or areas except for the LSI element forming region) is exposed by photolithography. Thereafter, in accordance with the type of resist, the exposed region (or the non-exposed region) of the resist film 18b is removed by development, and the surface of the LSI element forming region of the second interlayer insulating layer 16 is exposed as shown in FIG. 5C.

Figure 5D:
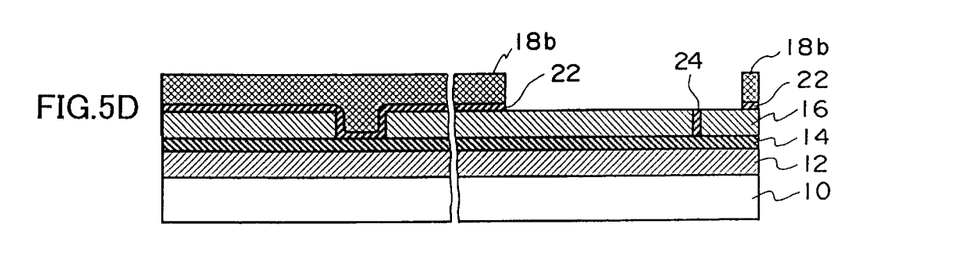
Figure 5E:
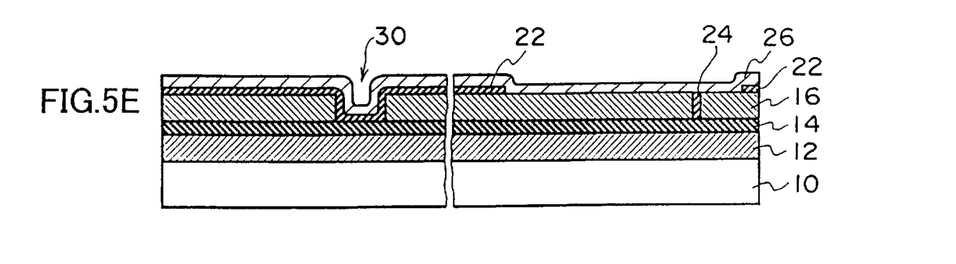

The filling material 22 on the surface of the exposed LSI element forming region is removed by etch-backing and, as shown in FIG. 5D, the only filling material 22 to remain is that inside the via hole 34, whereby the plug 24 is formed.

After the plug 24 has been formed, the resist film 18b is removed, and then the second wiring 26 is formed by photolithography and etching. As shown in FIG. 5E, a multilayer wiring structure is completed by electrically connecting the first wiring 14 and the second wiring 26 to each other via the plug 24.

In this way, when the filling material 22 on the surface of the LSI element forming region is etch-backed, the alignment mark 30 is coated with resist. Therefore, water in the air, metal contained in a wiring exposed at the bottom of the alignment mark (e.g., wiring such as aluminum), and components in the etching gas, such as residual chlorine, do not react. Because by-products are prevented from being produced, the high-quality alignment mark 30 having clear grating can be formed. As a result, when the second wiring 26 is formed, it is possible to align the wiring with high precision using the alignment mark 30.

Third Embodiment

Figure 6A:
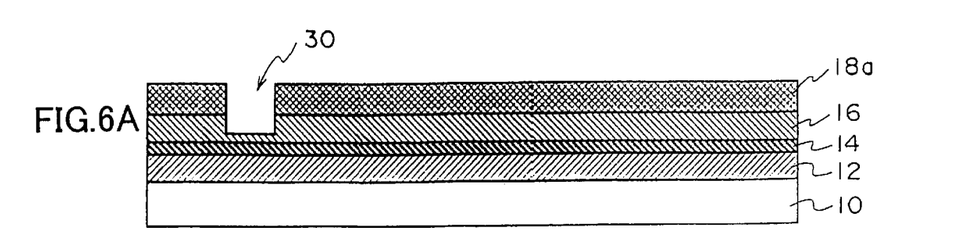
FIGS. 6A through 6E is process drawings illustrating an example of a third embodiment of the present invention.
Figure 6B:
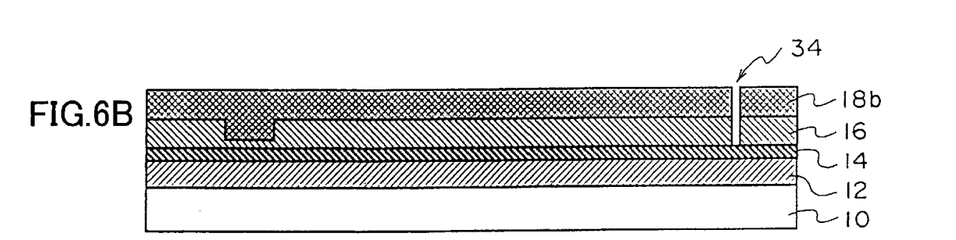
Figure 6C:
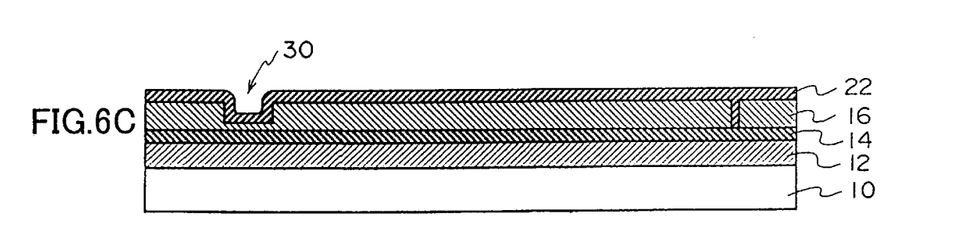
Figure 6D:
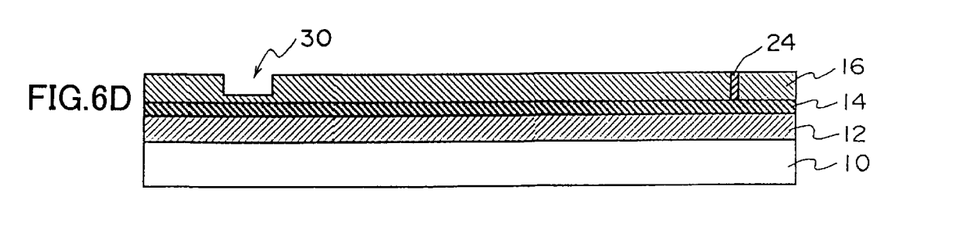
Figure 6E:
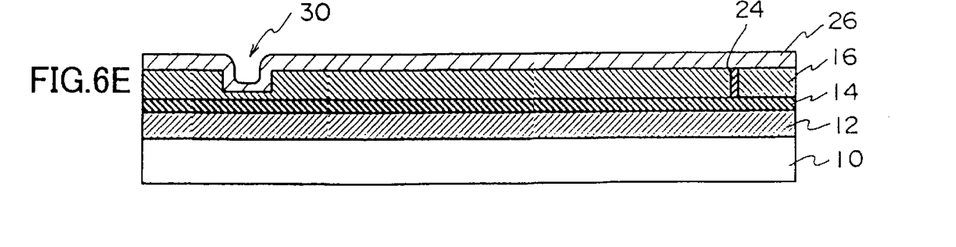

A third embodiment of the present invention will be described next. Portions identical to those of the first embodiment will be denoted by the same reference numerals, and description thereof will be omitted. The first wiring 14 is disposed below the second interlayer insulating layer 16 and the second wiring 26 is disposed above the second interlayer insulating layer 16 as shown in FIG. 6E. The first wiring 14 and the second wiring 26 are electrically connected to each other via the plug 24. The plug 24 is formed by filling a metal in the via hole 34. The via hole 34 is formed in the second interlayer insulating layer 16.

The first interlayer insulating layer 12 comprising $SiO_2$ or the like, the first wiring 14, and the second interlayer insulating layer 16 are sequentially disposed on the wafer 10. Then, resist is coated on the entire surface of the second insulating layer 16, to a thickness of about 300 nm to about 2000 nm, to form the resist film 18a.

Next, the pattern of the alignment mark 30 is exposed onto the alignment mark forming region 44b of the resist film 18a by photolithography. Alignment of the exposure position is carried out by using the alignment mark 30 which is formed on the alignment mark forming region 44a on the same layer as the lower layer having the pattern formed thereon during the previous step.

Thereafter, in accordance with the type of resist, the non-exposed region (or the exposed region) of the resist film 18a is removed by development to expose the surface of the second interlayer insulating layer 16 in conformity with the pattern of the alignment mark 30. Further, the exposed portion of the second interlayer insulating layer 16 is removed by etching. Here, etching time is controlled. For example, as shown in FIG. 6A, etching is finished when about 200 nm of the second interlayer insulating layer 16 remains from the bottom of the alignment mark 30.

Next, the resist film 18a is removed by etching, and resist is again coated on the entire surface, to a thickness of about 300 nm to about 2000 nm, to form the resist film 18b. The alignment mark 30 is filled in with the resist film 18b.

By using the alignment mark 30 formed in the alignment mark forming region 44a, a via hole pattern is formed at a predetermined position of the LSI element forming region of the resist film 18b by photolithography and etching. Then, in accordance with the type of resist, the non-exposed region (or the exposed region) of the resist film 18b is removed by development to expose the surface of the second interlayer insulating layer 16. Further, the exposed portion of the second interlayer insulating layer 16 is removed by etching to thereby form the via hole 34 as shown in FIG. 6B.

Next, the resist layer 18b is removed by etching. As shown in FIG. 6C, the electrically conductive filling material 22 is coated on the entire surface, to a thickness at which the entire via hole 34 is filled in with the material 22.

The filling material 22 is then removed by etch-backing. As shown in FIG. 6D, the only filling material 22 to remain is that inside the via hole 34, whereby the plug 24 is formed. After the plug 24 has been formed, the second wiring 26 is formed by photolithography and etching. As shown in FIG. 6E, a multilayer wiring structure is completed by electrically connecting the first wiring 14 and the second wiring 26 to each other via the plug 24.

In this way, etching is completed by leaving some of the second interlayer insulating layer 16 when forming the alignment mark 30 so that the first wiring 14 is not exposed. The remaining second insulating layer 16 acts to protect the first wiring 14. Therefore, since the first wiring 14 does not react with water in the air and components in the etching gas such as residual chlorine, the high-quality alignment mark 30 having clear grating can be formed. Consequently, by-products can be prevented from being produced at the bottom of the alignment mark 30, and when the second wiring 26 is formed, it is possible to align the wiring with high precision using the alignment mark 30.

In the third embodiment of the present invention, because the layer protecting the first wiring 14 can be formed merely by controlling the etching time of the second interlayer insulating layer 16, there is the advantage that additional manufacturing steps are not necessary and excessive costs are not incurred in forming the protective layer for the first wiring 14.

Fourth Embodiment

A fourth embodiment of the present invention will be described next. Portions identical to those of the first embodiment will be denoted by the same reference numerals, and description thereof will be omitted. The first wiring 14 is disposed below the second interlayer insulating layer and the second wiring 26 is disposed above the second interlayer insulating layer 16. The first wiring 14 and the second wiring 26 are electrically connected to one another through the via hole formed in the second interlayer insulating layer.

Figure 7A:
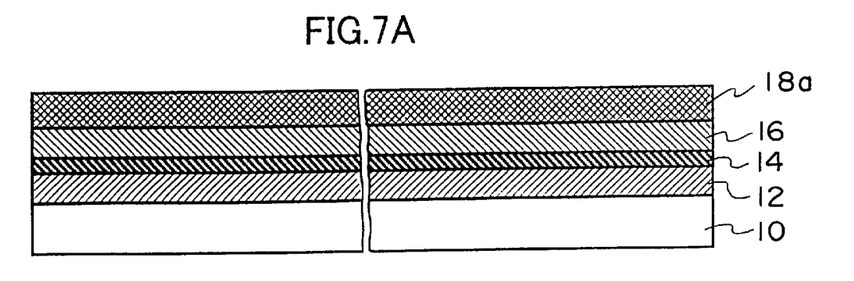
FIGS. 7A through 7D is a flow of steps illustrating an example of a fourth embodiment of the present invention.

As shown in FIG. 7A, the first interlayer insulating layer 12 comprising $SiO_2$ or the like, the first wiring 14, and the second interlayer insulating layer 16 are sequentially disposed on the surface of the wafer 10. Then, resist is coated on the entire surface of the second interlayer insulating layer 16, to a thickness of about 300 nm to about 2000 nm, to form the resist film 18a.

The pattern of the alignment mark 30 is formed by photolithography in the alignment mark forming region of the resist film 18a. The via hole pattern is formed at a predetermined position of the LSI element forming region.

Figure 7B:
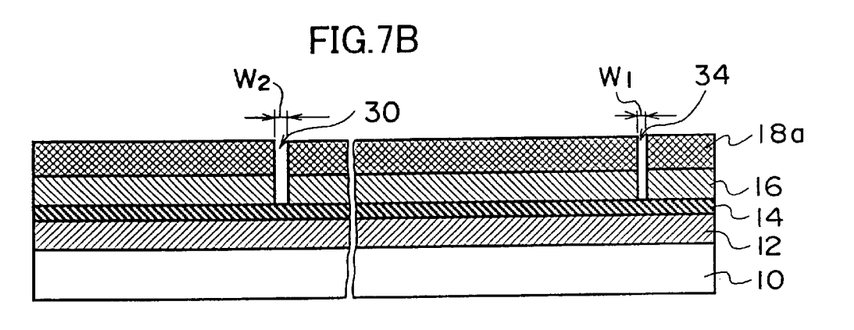

In accordance with the type of resist, the non-exposed region (or the exposed region) of the resist film 18a is removed by development to expose the surface of the second interlayer insulating layer 16 in conformity with the pattern. Further, the exposed portion of the second interlayer insu­lating layer 16 is removed by etching. As shown in FIG. 7B, the groove-shaped alignment mark 30 is formed in the alignment mark forming region. The via hole 34 is formed at a predetermined position of the LSI element forming region. Moreover, in the fourth embodiment of the present invention, a feature dimension W2 of the alignment mark 30 is determined to satisfy $W1<W2<W1\times 2$, wherein the diam­eter of the via hole 34 is W1.

Figure 7C:
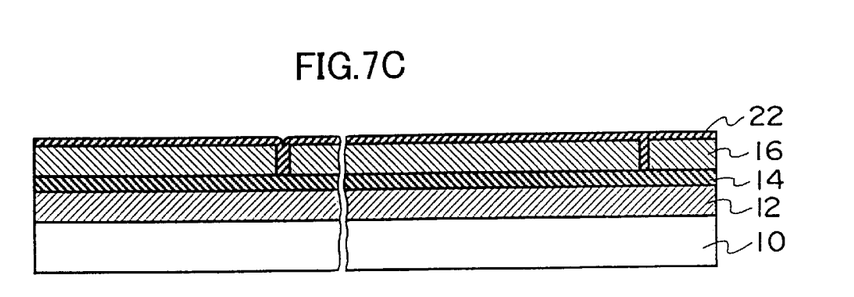

Next, the resist film 18a is removed by etching. As shown in FIG. 7C, the electrically conductive filling material 22 is coated on the entire surface of the wafer, to a thickness in which the entire portion of the second interlayer insulating layer 16, to a thickness at which the entire via hole 34 is filled in with the material 22. The filling material 22 is preferably coated in a thickness of W1.

In the fourth embodiment of the present invention, since the diameter W2 of the alignment mark 30 is determined to satisfy $W1<W2<W1\times 2$, if the filling material 22 is formed in the thickness of W1, the diameter W2 of the alignment mark 30 is larger than the diameter W1 of the via hole 34 and is smaller than twice the diameter W1 of the via hole 34. Accordingly, the filling material 22 in the region of the alignment mark 30 forms a cavity which is recessed about no more than W1 lower than the region of the via hole 34, by an amount resulting from the subtraction of the diameter W1 of the via hole 34 from the diameter W2 of the alignment mark 30.

The filling material 22 is removed by etch-backing so that the only filling material 22 to remain is that inside the via hole 34, whereby the plug 24 is formed. The filling material 22 remains inside the alignment mark 30, the plug 24 is formed, and the plug 24 acts as the protective layer for the first wiring 14.

Figure 7D:
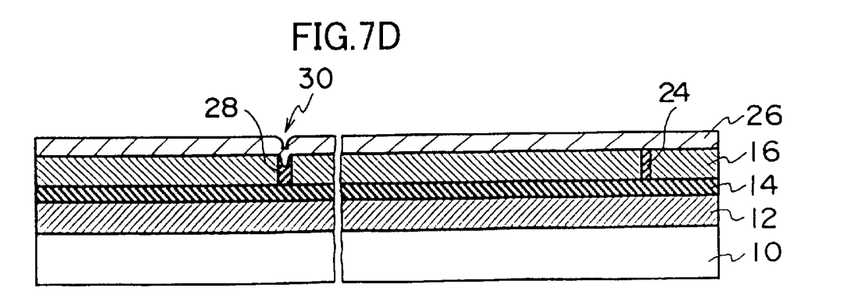

After the plug 24 has been formed, the second wiring 26 is formed by means of photolithography and etching. Accordingly, as shown in FIG. 7D, a multilayer wiring structure is completed by electrically connecting the first wiring 14 and the second wiring 26 to each other via the plug 24.

In this way, when the plug is formed in the through hole, the diameter of the alignment mark is determined, and the filling material 22 remains inside the alignment mark. For this reason, the exposure of the first wiring 14 at the bottom of the alignment mark is prevented after the plug has been formed inside the through hole. The residual filling material 22 acts as the protective layer, and reaction of the first wiring 14 with water in the air and components contained in the etching gas such as residual chlorine is prevented. Accordingly, the high-quality alignment mark having clear grating can be formed. By-products can be prevented from being produced at the bottom of the alignment mark 30. Consequently, when the second wiring 26 is formed, it is possible to align wiring with precision using the alignment mark 30.

Further, in the fourth embodiment, during the formation of the alignment mark 30, the filling material 22 remains within the alignment mark merely by controlling the size of the alignment mark 30. Accordingly, there is the advantage that additional manufacture steps are not necessary and excessive costs are not incurred in forming the protective layer for the first wiring 14.

In the above-described four embodiments of the present invention, a case has been described in which the alignment mark 30 comprises a concavegroove-shaped mark having a grating configuration. However, the present invention is not limited to the same, and a mark of any pattern, such as a bar, dot, cross, or triangular pattern can be employed as long as it can be used as an alignment mark. Further, the present invention is not limited to the concave alignment mark. A convex alignment mark can be used in the same manner as the concave alignment mark.

In each of the embodiments of the present invention described above, description has been given of the alignment mark employed in alignment exposure during the photolithographic step. However, the present invention can be applied to another alignment mark having the same structure as those described herein.

What is claimed is:

1. A method of manufacturing an alignment mark for aligning a pattern of a first pattern layer and a pattern of a second pattern layer in a predetermined layout when the first pattern layer and the second pattern layer are layered together on a wafer, comprising:

forming a first alignment mark in a predetermined region of the first pattern layer during the formation of the first pattern layer;

forming a second alignment mark by cutting the second pattern layer at a predetermined position thereof on the basis of the first alignment mark;

providing a protective layer for protecting the second alignment mark;

forming a predetermined pattern in a pattern forming region of the second pattern layer by using the first alignment mark;

forming resist to a thickness at which the second alignment mark is filled in thereby; and removing the resist and exposing the second alignment mark after the predetermined pattern has been formed in the pattern forming region of the second pattern layer.

2. The method according to claim 1, wherein the protective layer is formed by coating an insulating film material across the entire surface of the wafer, to a thickness at which the second alignment mark is not filled in by the material.

3. The method of claim 2, wherein the insulating film material is silicon dioxide.

4. The method of claim 2, wherein the insulating film material is silicon nitride.

5. The method of claim 1, wherein the first pattern layer is a wiring layer and the second pattern layer is an interlayer insulating film layer.

6. A method of manufacturing an alignment mark for aligning a pattern of a first pattern layer and a pattern of a second pattern layer in a predetermined layout when the first pattern layer and the second pattern layer are layered together on a wafer, comprising:

forming a first alignment mark in a predetermined region of the first pattern layer during the formation of the first pattern layer;

forming a second alignment mark by cutting the second pattern layer at a predetermined position thereof on the basis of the first alignment mark;

providing a protective layer for protecting the second alignment mark; and forming a predetermined pattern in a pattern forming region of the second pattern layer by using the first alignment mark, wherein the protective layer is formed by a remaining portion of the second pattern layer when the second alignment mark is formed by cutting the second pattern layer.

7. The method of claim 6, wherein the first pattern layer is a wiring layer and the second pattern layer is an interlayer insulating film.

8. A method of manufacturing an alignment mark for aligning a pattern of a first pattern layer and a pattern of a second pattern layer in a predetermined layout when the first pattern layer and the second pattern layer are layered together, comprising:

forming a first alignment mark in a predetermined region of the first pattern layer during the formation of the first pattern layer; and by using the first alignment mark, forming a second alignment mark at a predetermined position of the second pattern layer and forming a predetermined pattern in a pattern forming region of the second pattern layer, wherein a feature size $W_m$ of the second alignment mark and a feature size $W_v$ of the predetermined pattern which is formed on the second pattern layer are determined to satisfy $W_v < W_m < 2 \times W_v$.

9. The method of claim 8, wherein the first pattern layer is a wiring layer and the second pattern layer is an interlayer insulating film.

10. A method of manufacturing an alignment mark for aligning a pattern of a first pattern layer and a pattern of a second pattern layer in a predetermined layout when the first pattern layer and the second pattern layer are layered together on a wafer, comprising:

forming a first alignment mark in a predetermined region of the first pattern layer during the formation of the first pattern layer;

forming a second alignment mark by cutting the second pattern layer at a predetermined position thereof on the basis of the first alignment mark;

providing a protective layer for protecting the second alignment mark; and forming a predetermined pattern in a pattern forming region of the second pattern layer by using the first alignment mark, wherein the protective layer is formed by coating an insulating film material across the entire surface of the wafer, to a thickness at which the second alignment mark is not filled in by the material, and wherein a feature size $W_m$ of the second alignment mark and a feature size $W_v$ of the pattern of the second pattern layer are determined to satisfy $W_v < W_m < 2 \times W_v$, and the insulating film material is coated to substantially the same thickness as that of the feature size $W_v$.

11. The method of claim 10, wherein the first pattern layer is a wiring layer and the second pattern layer is an interlayer insulating film.

12. The method of claim 10, wherein the insulating film material is silicon dioxide.

13. The method of claim 10, wherein the insulating film material is silicon nitride.

* * * * *